(12) United States Patent
Chen (10) Patent No.: US 7,639,074 B2
(45) Date of Patent: Dec. 29, 2009

(54) LINEAR PROGRAMMABLE SWITCH-CAPACITANCE GAIN AMPLIFIER

(75) Inventor: Yi-Chen Chen, Hsinchu (TW)

(73) Assignee: Holtek Semiconductor Inc., Hsinchu (TW)

( * ) Notice: Subject to any disclaimer, the term of this patent is extended or adjusted under 35 U.S.C. 154(b) by 58 days.

(21) Appl. No.: 12/010,236

(22) Filed: Jan. 23, 2008

(65) Prior Publication Data

US 2008/0297243 A1    Dec. 4, 2008

(30) Foreign Application Priority Data

Jun. 1, 2007    (TW) .............................. 96119835 A (51) Int. Cl.
*H03F 1/02* (2006.01)
*H03G 3/14* (2006.01)

(52) U.S. Cl. ............................................. 330/9; 330/86

(58) Field of Classification Search ............... 330/9, 330/86, 282
See application file for complete search history.

(56) References Cited

U.S. PATENT DOCUMENTS 7,276,962 B1 *    10/2007    Tomasi .......................... 330/9

* cited by examiner

*Primary Examiner*—Steven J Mottola
(74) *Attorney, Agent, or Firm*—Rosenberg, Klein & Lee (57) ABSTRACT

A linear programmable switch-capacitance gain amplifier (PGA) is described. The PGA divides the dB-gain curve into several parts by the concept of piece-wise linearity, and then simultaneously executes the dB-linear gain adjustment of MSB and the LSB at the same gain stage. Present invention achieves the PGA dB-linearity by setting up every capacitance of the sampling capacitor array and the holding capacitor array, then arranging the sampling capacitor array and the holding capacitor array by coordinating the switching of the capacitor switches.

16 Claims, 6 Drawing Sheets

LINEAR PROGRAMMABLE SWITCH-CAPACITANCE GAIN AMPLIFIER

BACKGROUND OF THE INVENTION

1. Field of the Invention

The present invention is related to a gain amplifier, in particular, to a linear programmable switch-capacitance gain amplifier (PGA).

2. Description of Related Art

Figure 7:
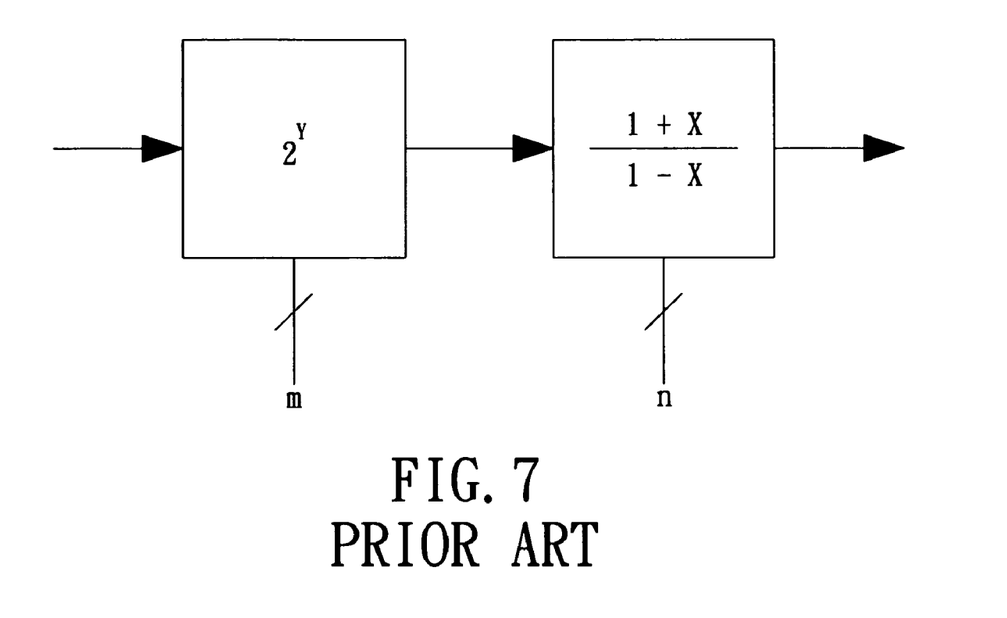
FIG. 7 shows an architecture diagram of a prior art linear programmable switch-capacitance gain amplifier using 2 parts of operation.
Figure 8:
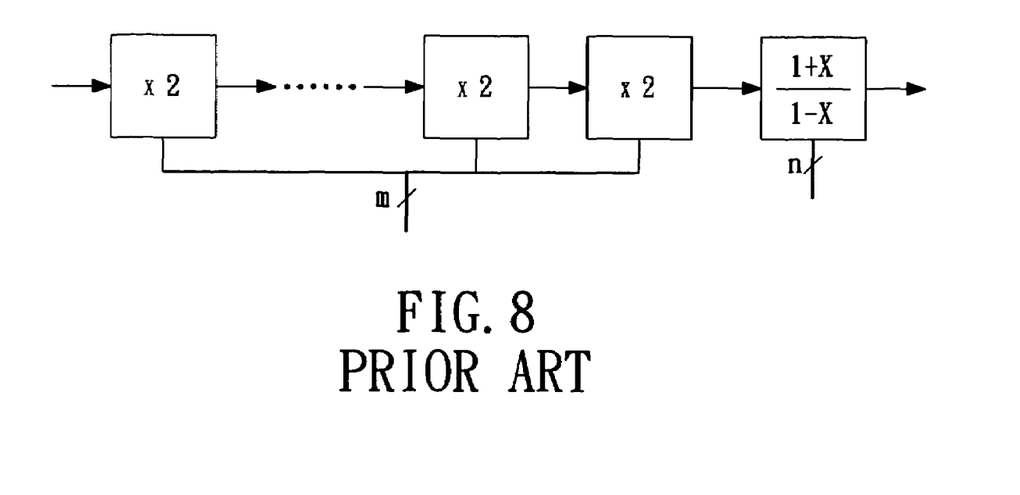
FIG. 8 shows an architecture diagram of a prior art linear programmable switch-capacitance gain amplifier using several parts of operation.
Figure 9:
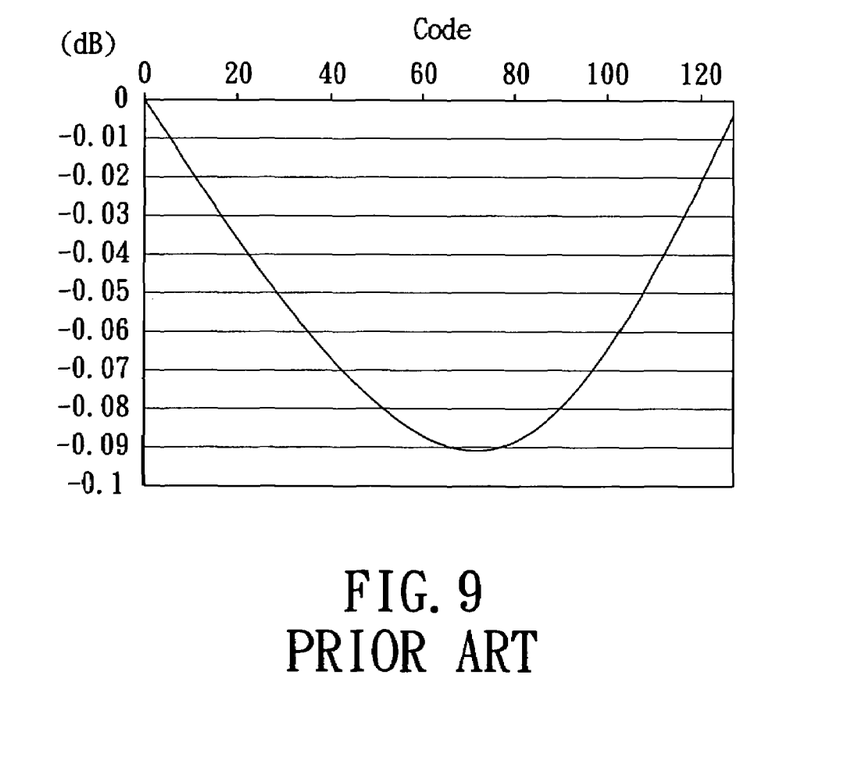
FIG. 9 shows a representation diagram of error values of a prior art linear programmable switch-capacitance gain amplifier.

A commonly used linear programmable switch-capacitance gain amplifier (PGA) employs $$\frac{1+x}{1-x}$$

for approximating operations. In case of applications requiring wider range of adjustment and better precision, the entire linear programmable switch-capacitance gain amplifier will be divided into two or more parts, as shown in FIG. 7, which illustrates an architecture of a prior art linear programmable switch-capacitance gain amplifier using 2 parts of operation, as well as shown in FIG. 8, which illustrates an architecture of a prior art linear programmable switch-capacitance gain amplifier using several parts of operation. At the stage of Least Significance Bits (LSB), it generally uses the approximately linear $$\frac{1+x}{1-x}$$

for implementing 0-6 dB, from which the derived maximum error will be about −0.09 dB, as shown in FIG. 9, which shows a diagram representing the error in a prior art linear programmable switch-capacitance gain amplifier. However, even though the error is of small magnitude, there exists a disadvantage in that such a linear programmable switch-capacitance gain amplifier needs at least one more gain stage.

SUMMARY OF THE INVENTION

In view of the aforementioned disadvantage, the present invention is, by means of allowing multiplication/division relation between sampling capacitors and holding capacitors at the same gain stage, to realize gain (dB)=sampling capacitor CS (dB)−holding capacitor CH (dB), so as to be able to accomplish the entire programmable switch-capacitance gain amplification at the same gain stage.

To achieve the objective described supra, the present invention provides a linear programmable switch-capacitance gain amplifier, which includes a first sampling capacitor array, a first holding capacitor array, an operational amplifier, a second sampling capacitor array and a second holding capacitor array.

One end of the above-mentioned first sampling capacitor array is connected to a positive voltage input through a first switch, and the first sampling capacitor array consists of: a first sampling capacitor; and a plurality of second sampling capacitance switch sets, which are mutually connected in parallel, each having a second sampling capacitor and a switch, whereas the second sampling capacitor and the switch are connected in series; wherein the first sampling capacitor and these second sampling capacitance switch sets are connected in parallel.

One end of the above-mentioned first holding capacitor array is connected to the opposite end of the end at which the first sampling capacitor array connects to the positive voltage input, and connected to a bias voltage through a second switch, whereas the other end of the first holding capacitor array is connected to a positive voltage output through a third switch, and connected to the bias voltage via a fourth switch, wherein the first holding capacitor array consists of: a plurality of first holding capacitance switch sets, which are mutually connected in parallel, each having a first holding capacitor and a switch, in which the first holding capacitor and the switch are connected in series.

The positive input of the aforementioned operational amplifier is connected between the first sampling capacitor array and the first holding capacitor array, and connected to the bias voltage through the second switch, whereas the negative input of the operational amplifier is connected to the bias voltage via a fifth switch, and the negative voltage output of the operational amplifier is, via the third switch, connected between the first holding capacitor array and the fourth switch, and the positive voltage output of the operational amplifier is connected to the negative voltage output of the operational amplifier through a sixth switch.

One end of the above-mentioned second sampling capacitor array is connected to a negative voltage input via a seventh switch, and connected between the first switch and the first sampling capacitor array via an eighth switch, whereas the other end of second sampling capacitor array is connected between the fifth switch and the negative voltage input of the operational amplifier, wherein the second sampling capacitor array includes: a third sampling capacitor; and a plurality of fourth sampling capacitance switch sets, which are mutually connected in parallel, each having a fourth sampling capacitor and a switch, wherein the fourth sampling capacitor is connected with the switch in series; in which the third sampling capacitor and those fourth sampling capacitance switch sets are connected in parallel.

One end of the above-mentioned second holding capacitor array is connected to the opposite end of the end at which the second sampling capacitor array connects to the negative voltage input, and connected between through the fifth switch and the negative voltage input of the operational amplifier, whereas the other end of the second holding capacitor array is connected to the negative voltage output through a ninth switch, and connected to the bias voltage via a tenth switch, wherein the second holding capacitor array consists of: a plurality of second holding capacitance switch sets, which are mutually connected in parallel, each having a second holding capacitor and a switch, in which the second holding capacitor and the switch are connected in series.

In order to further understand the techniques, means and effects the present invention takes to achieve the prescribed objectives, the following detailed descriptions and appended drawings are hereby referred, such that, through which, the purposes, features and aspects of the present invention can be thoroughly and concretely appreciated; however, the appended drawings are merely provided for reference and illustration, without any intention to be used for limiting the present invention.

DETAILED DESCRIPTION OF THE PREFERRED EMBODIMENTS

Figure 1:
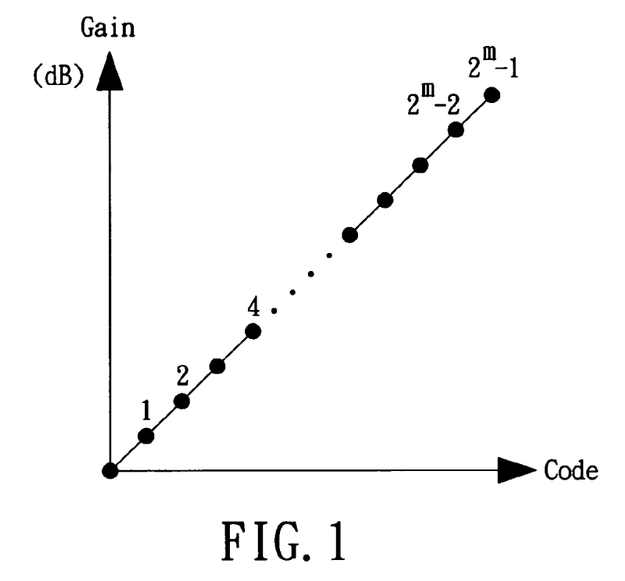
FIG. 1 shows a curve chart of Maximum Significance Bits (MSB) gain adjustment.

Referring now to FIG. 1, in which a curve chart of Maximum Significance Bits (MSB) gain adjustment is illustrated. As shown, the present invention, using a concept of piecewise linearity, divides first the entire dB gain curve into $2^m$ parts, wherein m represents the number of bits in the Maximum Significance Bits (MSB), meanwhile the rest n bits are the Least Significance Bits (LSB), and N represents the total number of bit which equals m+n In general, two gain stages are taken for implementing, in which one stage is responsible for MSB, and the other is for LSB. But this approach will require one more operational amplifier (OPAMP), which occupies usable area and consumes more energy. Hence, the present invention proposes a method of implementing both the MSB and LSB dB-linear gain adjustments at the same gain stage.

Since LSB is a smaller part of a code, we are aware that, when $x \to 0$, $e^x \approx 1+x$, which means we can implement LSB in a fashion of linear increment, while avoiding causing unacceptable errors. In addition, in the MSB part, since it is impossible to implement by means of $$\frac{1+x}{1-x}$$

because the error resulted might become too big, thus the present invention will, with pre-calculated gains, implement MSB directly by means of switch selections.

Figure 2:
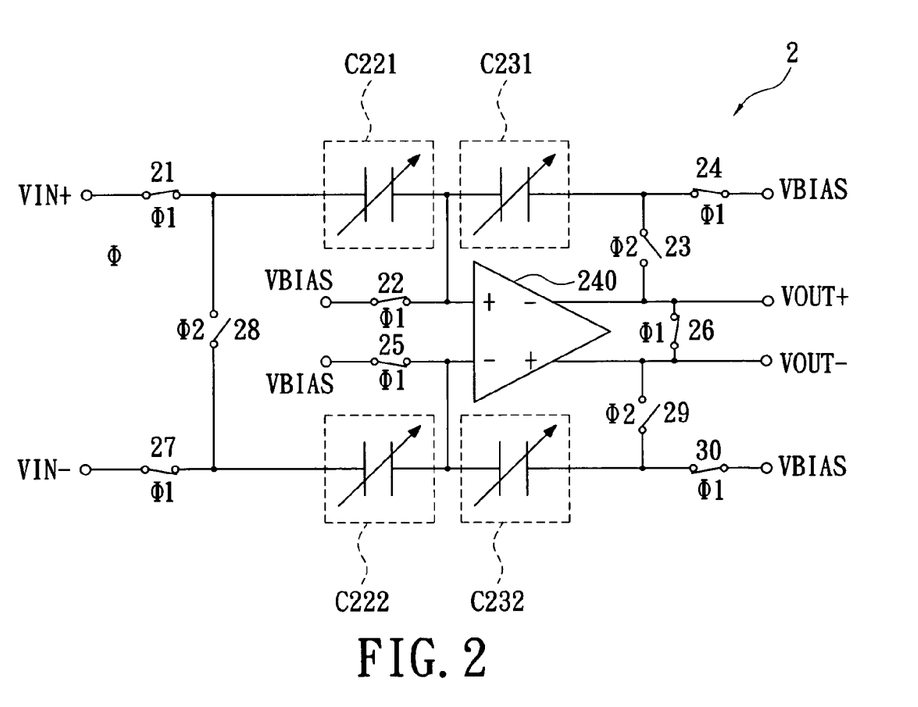
FIG. 2 shows a circuit diagram of a general typical switch-capacitance gain amplifier.

Referring now to FIG. 2, in which a circuit diagram of a general typical switch-capacitance gain amplifier is shown. When a common switch capacitance gain amplifier 2 is at a sampling phase, the first switch 21, second switch 22, fourth switch 24, fifth switch 25, sixth switch 26, seventh switch 27 and tenth switch 30 are closed (logic 1, high), but the third switch 23, eighth switch 28 and ninth switch 29 are disconnected (logic 0, low), and at this moment, the sampling capacitor arrays C221, C222 are respectively connected to positive voltage input VIN+ and negative voltage input VIN− on one end, while on the other end thereof are connected to the bias voltage VBIAS; the holding capacitor arrays C231, C232 are connected to the bias voltage VBIAS on two ends; the operational amplifier forms an open-loop status, whose positive output voltage end VOUT+ and negative output voltage end VOUT− are short circuited together by means of the sixth switch 26.

When at the holding phase, the first switch 21, second switch 22, fourth switch 24, fifth switch 25, sixth switch 26, seventh switch 27 and tenth switch 30 are disconnected (logic 0, low), whereas the third switch 23, eighth switch 28 and ninth switch 29 are closed (logic 1, high), and at this moment, the charges inside the sampling capacitor arrays C221, C222 will transfer to the holding capacitor arrays C231, C232. Therefore, the operational amplifier 240 may obtain an amplification output of $$VOUT_+ - VOUT_- = \frac{C221}{C231} * (VIN_+ - VIN_-),$$

according the principle of conservation of charge.

Figure 3A:
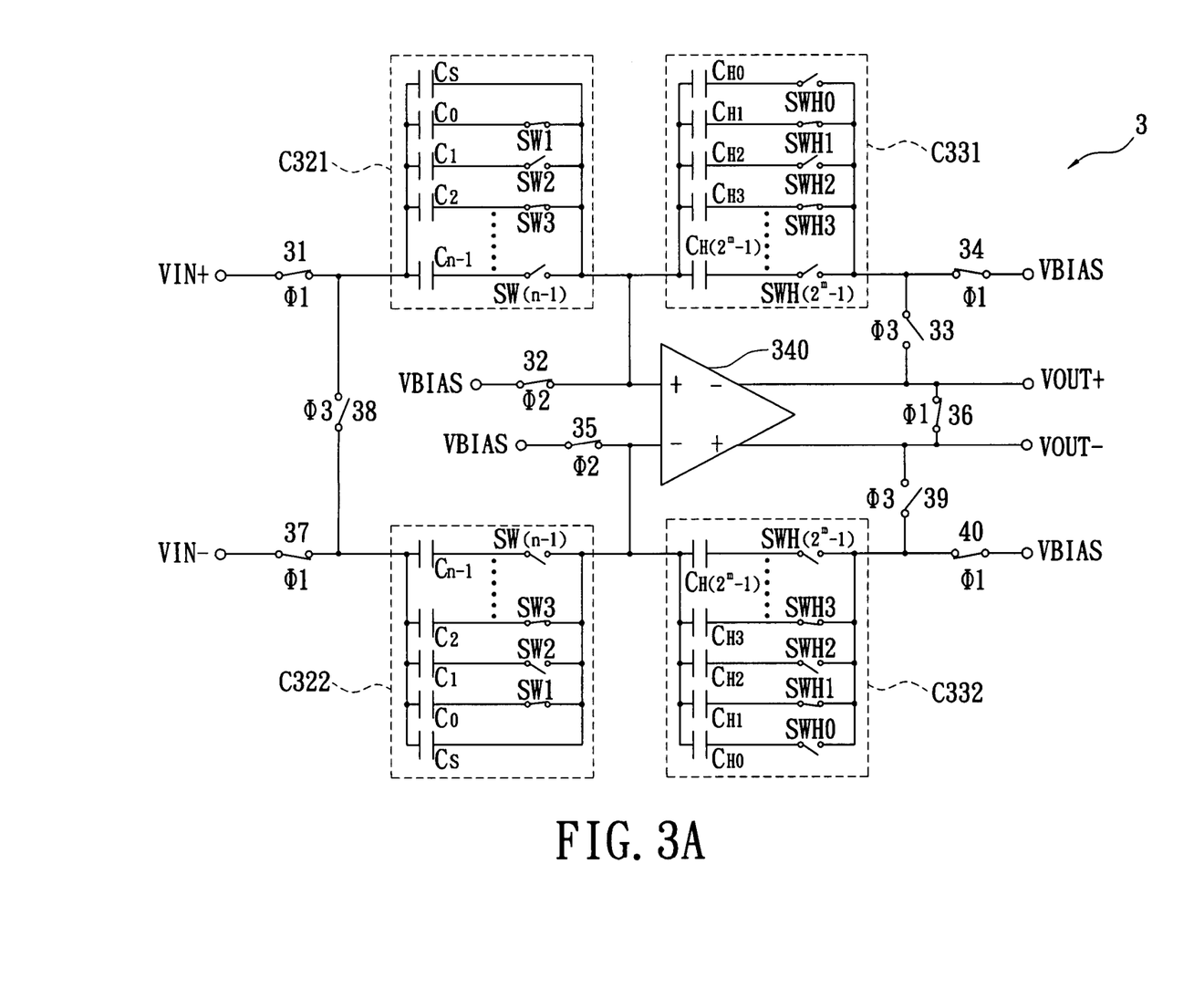
FIG. 3A shows a circuit diagram of a linear programmable switch-capacitance gain amplifier according to the present invention.
Figure 3B:
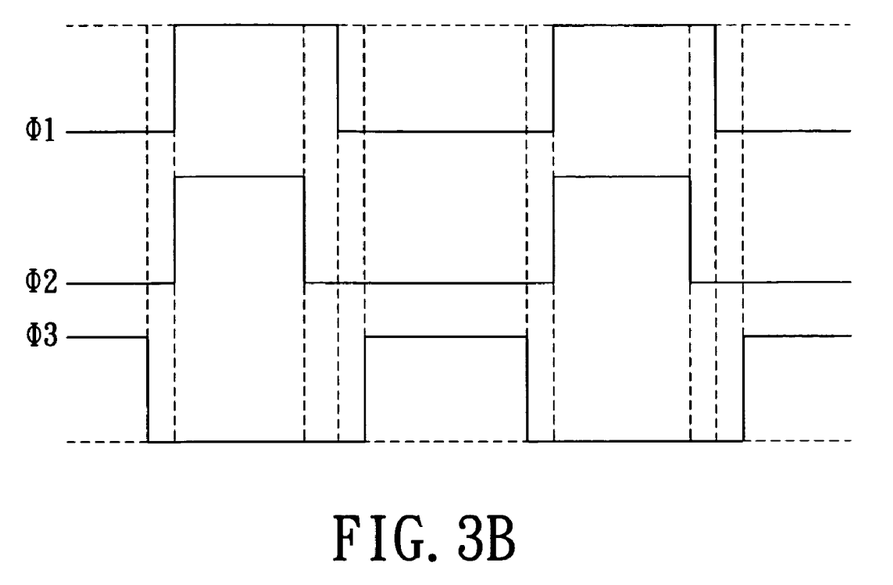
FIG. 3B shows a time sequence diagram of each switch in a linear programmable switch-capacitance gain amplifier according to the present invention.

Referring next to FIG. 3A, in which a circuit diagram of a linear programmable switch-capacitance gain amplifier according to the present invention is shown, and concurrently also referring to FIG. 3B, therein a time sequence diagram of each switch in a linear programmable switch-capacitance gain amplifier according to the present invention is illustrated. When the first switch 31, fourth switch 34, sixth switch 36, seventh switch 37 and tenth switch 40 are closed (logic 1, high) subject to the control of the first clock signal $\Phi 1$, the analog input signals of the positive voltage input VIN+ and the negative voltage input VIN− will be stored inside sampling capacitor arrays C321 (the first sampling capacitor array) and C322 (the second sampling capacitor array) in the form of charges. Charges in the holding capacitor arrays C331, C332 will be zero (0), since both ends thereof are connected to the bias voltage VBIAS of the same potential. Next, before the disconnection (logic 0, low) of the first switch 31, fourth switch 34, sixth switch 36, seventh switch 37 and tenth switch 40 subject to the control of the first clock signal $\Phi 1$, the second switch 32 and fifth switch 35 will be cut and become disconnected (logic 0, low) subject to the control of the second clock signal $\Phi 2$, i.e. the conventional so-called bottom sampling approach. At last, the third switch 33, eighth 38 and ninth switch 39 will be closed (logic 1, high) subject to the control of the third clock signal $\Phi 3$, transferring the charges stored in the sampling capacitor arrays C321, C322 to the holding capacitor arrays C331, C332, thus generating amplified voltage at the voltage output VOUT, wherein VOUT=VIN*(C321/C331) or VOUT=VIN*(C322/C332).

In the sampling capacitor arrays C321, C322 and holding capacitor arrays C331, C332, the relations among each capacitor follow the equations as below:

$$C_{n-1} = 2*C_{n-2} = 4*C_{n-3} = \ldots = 2^{n-1}*C_0 \qquad (1)$$

$$C_{Hx} = \frac{C_S}{10^{\frac{max\_dB\_gain}{20} \times \frac{x}{2^m}}} \qquad (2)$$

$$\frac{C_0}{C_S} \times 2^n = \frac{C_{H0}}{C_{H1}} - 1 \qquad (3)$$

wherein $x = 0 \sim 2^m - 1$, and according to equation (2) it is possible to obtain the relation between the capacitor CHx in the holding capacitor arrays C331, C332 and the capacitor Cs in the sampling capacitor arrays C321, C322; Also, according to equation (3), it is possible to obtain the relation between the capacitor $C_0$ in the sampling capacitor arrays C321, C322 and the Cs.

The gain in the linear programmable switch-capacitance gain amplifier 3 is PGA gain $$(2^n \cdot x + p) = \frac{C_S + C_0 \cdot p}{C_{Hx}} = \frac{C_S}{C_{Hx}} \cdot \frac{C_S + C_0 \cdot p}{C_S},$$

in which $p=0\sim2^n-1$, and $x=0\sim2^m-1$. Next, suppose the PGA gain is taken in dB, then it means that dB_gain can be represented as $$(2^n \cdot x + p) = 20 \cdot \log\left(\frac{C_S}{C_{Hx}}\right) + 20 \cdot \log\left(1 + p \cdot \frac{C_0}{C_S}\right),$$

and the linear-in-dB gain adjustment transfer curve with piece-wise linear approximation can be thus be obtained.

On the other hand, a binary PGA code is divided into MSB of m bits and LSB of n bits. Here, the binary code of MSB will go through a decoder for decoding, so as to generate the switching that controls the switches (SWHx, $x=0\sim2^m-1$) to which the capacitor CHx ($x=0\sim2^m-1$) in the holding capacitor arrays C331, C332 corresponds; and the binary code of LSB directly controls the switching of switches (SWx, $x=0\sim n-1$) to which the capacitor Cx ($x=0\sim n-1$) in the sampling capacitor arrays C321, C322 corresponds.

Therefore, by means of the above-mentioned equations, the present invention implements each capacitance in conjunction with the delicate arrangements of the sampling capacitor arrays C321, C322 and holding capacitor arrays C331, C332, thus achieving the PGA dB-linearity of the programmable switch-capacitance gain amplifier. Which when compared with a conventional fashion of using sampling capacitor arrays fitted to the holding capacitor array with a constant value then later adjust the capacitances in the sampling capacitor arrays and holding capacitor arrays in the holding stage, this $$\frac{1+x}{1-x}$$

dB-linear approach indeed offer better precision. Futhermore, one single operational amplifier can accomplish a wide range of programmable switch-capacitance gain amplifier gains (PGA gain), compared with the conventional amplifiers requiring two or more operational amplifiers, the present invention saves more usable area and consumes less energy.

Figure 4:
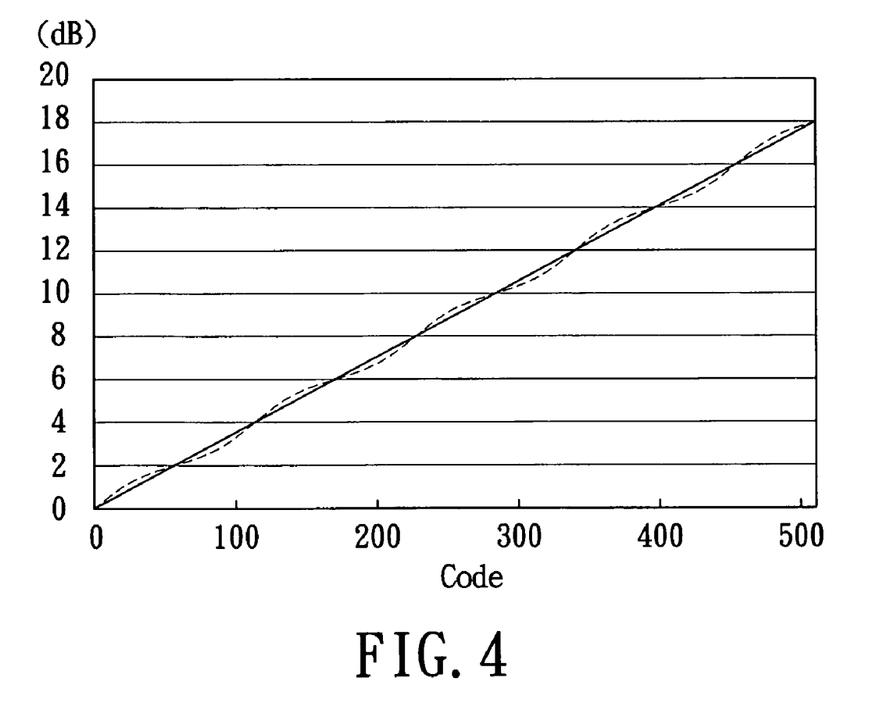
FIG. 4 shows a transition curve chart of PGA code vs. PGA gain (dB)
Figure 5:
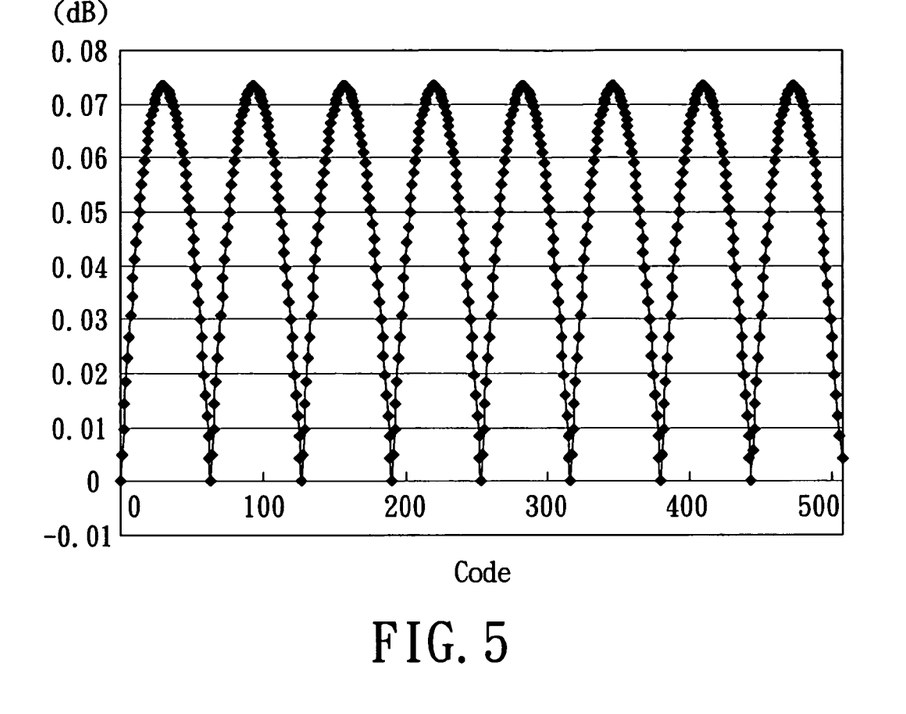
FIG. 5 shows a representation diagram of errors between the transition curve simulation values and ideal values.

Subsequently, take a 9-bit dB linear gain adjustment for max dB gain of 18.0625 dB for example. 1 LSB=max dB gain/511☐0.035 dB. Let's first assume the number of bits m for MSB is 3, the number of bits n for LSB is 6, and capacitor Cs=5000 fF. From the aforementioned equations, it can be known that, in the holding capacitor arrays C331, C332, $CH_0$=5000 fF, $CH_1$=3855.5 fF, $CH_2$=2973.0 fF, $CH_3$=2292.4 fF, ..., $CH_7$=810.5 fF, and also, in the sampling capacitor arrays C321, C322, $C_0$=23.2 fF, $C_1$=2*$C_0$=46.4 fF, $C_2$=2*$C_1$=92.8 fF, ..., $C_5$=742.4 fF. Placing these data for simulation, it will give the results shown in FIGS. 4 and 5, in which FIG. 4 shows a transition curve chart of PGA code vs. PGA gain (dB), herein the solid line represents simulation results of the above-mentioned data, and the dotted line depicts the ideal result; FIG. 5 shows a representation diagram of errors between the transition curve simulation values and ideal values. From FIGS. 4 and 5, it can be seen that the linear programmable switch-capacitance gain amplifier according to the present invention implements a nearly ideal linear gain curve.

Figure 6:
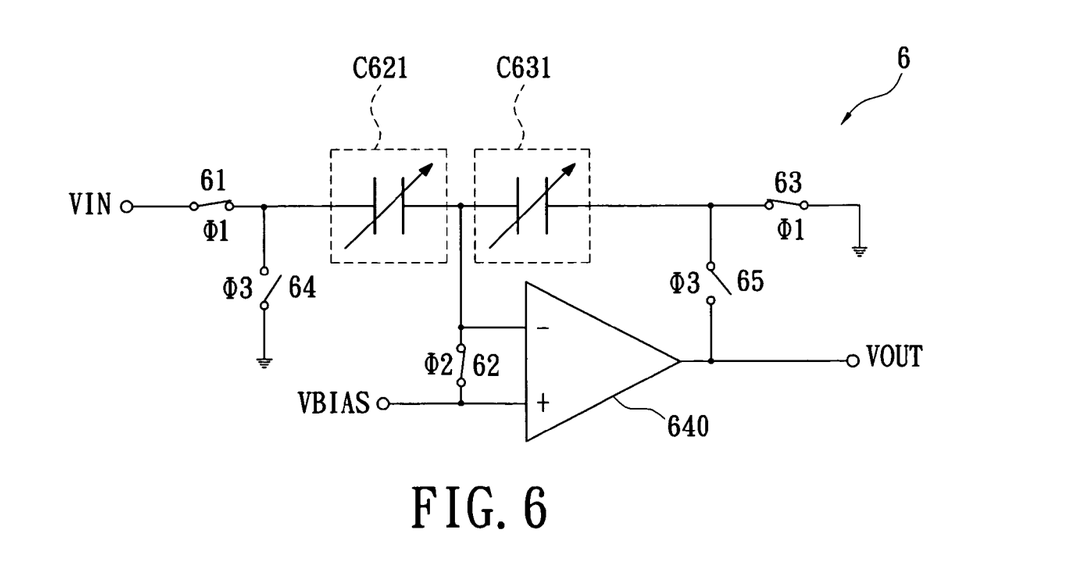
FIG. 6 shows a circuit diagram of the single-side linear programmable switch-capacitance gain amplifier according to the present invention.

Next referring to FIG. 6, a circuit diagram of the single-side linear programmable switch-capacitance gain amplifier according to the present invention is shown. The operational principle is, as described supra, the individual capacitances of the sampling capacitor array C621 and the holding capacitor array C631 are decided by equations 1, 2 and 3, manipulating the transfers of charges between the sampling capacitor array C621 and the holding capacitor array C631 through using the first clock signal (e.g. Φ1 in FIG. 3B) to control the first switch 61 and third switch 63, the second clock signal (e.g. Φ2 in FIG. 3B) to control the second switch 62, and the third clock signal (e.g. Φ3 in FIG. 3B) to control the fourth switch 64 and fifth switch 65. The adjustment of capacitance in the sampling capacitor array C621 and the holding capacitor array C631, also as above illustrated, is performed by letting the binary code of MSB go through a decoder for decoding, so as to control the switching of the switch to which the capacitor CHx ($x=0\sim2^m-1$) in the holding capacitor array C631 corresponds; whereas the binary code of LSB directly controls the switching of the switch to which the capacitor Cx ($x=0\sim n-1$) in the sampling capacitor array C621 corresponds, wherein m is the number of bits in MSB, n is the number of bits in LSB. In this way, it is possible to enable the single side linear programmable switch-capacitance gain amplifier 6 to implement a nearly ideal linear gain curve.

In summary, the linear programmable switch-capacitance gain amplifier according to the present invention provides the function of achieving the entire programmable gain amplification at the same stage, thus simplifying design works for cost-savings, and also reducing power consumptions, suitable for applications on consumer, portable devices.

The above-mentioned descriptions represent merely the preferred embodiment of the present invention, without any intention to limit the scope of the present invention thereto. Various equivalent changes, alternations or modifications based on the claims of present invention are all consequently viewed as being embraced by the scope of the present invention.

What is claimed is:

1. A linear programmable switch-capacitance gain amplifier (PGA), comprising:
   a first sampling capacitor array, wherein a first end of the first sampling capacitor array is connected to a positive voltage input through a first switch, and wherein the first sampling capacitor array consists of:
   a first sampling capacitor; and
   a plurality of second sampling capacitance switch sets mutually connected in parallel, each having a second sampling capacitor and a switch, the second sampling capacitor and the switch being connected in series,
   wherein the first sampling capacitor and the second sampling capacitance switch sets are connected in parallel;
   a first holding capacitor array, wherein one end of the first holding capacitor array is connected to the end opposite to said first end of the first sampling capacitor array connected to the positive voltage input, and wherein said one end of said first holding capacitor array is connected to a bias voltage through a second switch, wherein another end of the first holding capacitor array is connected to a positive voltage output through a third switch, and connected to the bias voltage via a fourth switch, wherein the first holding capacitor array consists of:

a plurality of first holding capacitance switch sets mutually connected in parallel, each having a first holding capacitor and a switch, wherein the first holding capacitor and the switch are connected in series; an operational amplifier, the operational amplifier having a positive input connected between the first sampling capacitor array and the first holding capacitor array, and connected to the bias voltage through the second switch, wherein a negative input of the operational amplifier is connected to the bias voltage via a fifth switch, and the negative voltage output of the operational amplifier is connected through the third switch between the first holding capacitor array and the fourth switch, and wherein the positive voltage output of the operational amplifier is connected to the negative voltage output of the operational amplifier through a sixth switch;

a second sampling capacitor array, wherein one end of the second sampling capacitor array is connected to the negative voltage input by means of a seventh switch, and connected between the first switch and the first sampling capacitor array via an eighth switch, wherein another end of said second sampling capacitor array is connected between the fifth switch and the negative voltage input of the operational amplifier, wherein the second sampling capacitor array consists of:

a third sampling capacitor; and a plurality of fourth sampling capacitance switch sets, which are mutually connected in parallel, each having a fourth sampling capacitor and a switch, wherein the fourth sampling capacitor is connected with the switch in series;

wherein the third sampling capacitor and the fourth sampling capacitance switch sets are connected in parallel;

a second holding capacitor array, wherein one end of the second holding capacitor array is connected to the end opposite to said one end of the second sampling capacitor array connected to the negative voltage input, and also is connected between the fifth switch and the negative voltage input of the operational amplifier, wherein another end of the second holding capacitor array is connected to the negative voltage output through a ninth switch, and connected to the bias voltage via a tenth switch, wherein the second holding capacitor array consists of:

a plurality of second holding capacitance switch sets mutually connected in parallel, each having a second holding capacitor and a switch, in which the second holding capacitor and the switch are connected in series, wherein the first switch, forth switch, sixth switch, seventh switch and tenth switch are controlled by a first clock signal, the second switch and fifth switch are controlled by a second clock signal, and the third switch, eighth switch and ninth switch are controlled by a third clock signal.

2. The linear programmable switch-capacitance gain amplifier (PGA) according to claim 1, wherein the gain curve of the linear programmable switch-capacitance gain amplifier is divided into $2^m$ parts, in which m represents the number of bits in Maximum Significance Bits (MSB).

3. The linear programmable switch-capacitance gain amplifier (PGA) according to claim 2, wherein the total number of bits in the binary PGA code of the linear programmable switch-capacitance gain amplifier is the number of bits in Maximum Significance Bits (MSB) plus the number of bits in Least Significance Bits (LSB).

4. The linear programmable switch-capacitance gain amplifier (PGA) according to claim 2, wherein the switches connected in series to the first holding capacitors, and switches connected in series to the second holding capacitors, are controlled by the binary code of MSB after being decoded by a decoder.

5. The linear programmable switch-capacitance gain amplifier (PGA) according to claim 3, wherein the switches connected in series to the second sampling capacitors, and switches connected in series to the fourth sampling capacitors, are controlled by the binary code of LSB.

6. The linear programmable switch-capacitance gain amplifier (PGA) according to claim 3, wherein the relation between the second sampling capacitors in the second sampling capacitor switch sets, as well as the relation between the fourth sampling capacitors in the fourth sampling capacitor switch sets, is:

$$C_{n-1}=2*C_{n-2}=4*C_{n-3}=\ldots=2^{n-1}*C_0$$

wherein n represents the number of bits in LSB.

7. The linear programmable switch-capacitance gain amplifier (PGA) according to claim 3, wherein the relation between the first sampling capacitor and the first holding capacitors, as well as the relation between the third sampling capacitor and the second holding capacitors, is:

$$C_{Hx} = \frac{C_S}{10^{\frac{max\_dB\_gain}{20}} \times \frac{x}{2^m}}$$

wherein Cs is the first sampling capacitor or the third sampling capacitor, CHx means the first holding capacitors or the second holding capacitors, x ranges $0\sim2^m-1$, m represents the number of bits in MSB.

8. The linear programmable switch-capacitance gain amplifier (PGA) according to claim 7, wherein the relation between the first sampling capacitor and the second sampling capacitor of the least capacitance in the second sampling capacitors, as well as the relation between the third sampling capacitor and the fourth sampling capacitor of the least capacitance in the fourth sampling capacitors, is:

$$\frac{C_0}{C_S} \times 2^n = \frac{C_{H0}}{C_{H1}} - 1$$

wherein Co is the second sampling capacitor of the least capacitance in the second sampling capacitors or the fourth sampling capacitor of the least capacitance in the fourth sampling capacitors, and n represents the number of bits in LSB.

9. A linear programmable switch-capacitance gain amplifier (PGA) of a single-side embodiment, comprising:

a first sampling capacitor array, wherein one end of the first sampling capacitor array is connected to a voltage input via the first switch, and is connected to ground via the fourth switch, wherein the first sampling capacitor array consists of:

a first sampling capacitor; and a plurality of second sampling capacitance switch sets mutually connected in parallel, each having a second sampling capacitor and a switch, wherein the second sampling capacitor and the switch are connected in series, wherein the first sampling capacitor and the second sampling capacitance switch sets are connected in parallel;

a first holding capacitor array, wherein one end of the first holding capacitor array is connected to the end opposite to said one end of the first sampling capacitor array connected to the voltage input, and wherein another end of the first holding capacitor array is connected to ground through a third switch, wherein the first holding capacitor array consists of:

a plurality of first holding capacitance switch sets mutually connected in parallel, each having a first holding capacitor and a switch, wherein the first holding capacitor and the switch are connected in series; and an operational amplifier, wherein a negative input of the operational amplifier is connected between the first sampling capacitor array and the first holding capacitor array, and connected to a positive input of the operational amplifier through a second switch, wherein the positive input of the operational amplifier is connected to a bias voltage, and the voltage output of the operational amplifier is connected through a fifth switch between the first holding capacitor array and the third switch, wherein the first and third switches are controlled by a first clock signal, the second switch is controlled by a second clock signal, and the forth and fifth switches are controlled by a third clock signal.

10. The linear programmable switch-capacitance gain amplifier (PGA) according to claim 9, wherein the gain curve of the linear programmable switch-capacitance gain amplifier is divided into $2^m$ parts, in which m represents the number of bits in Maximum Significance Bits (MSB).

11. The linear programmable switch-capacitance gain amplifier (PGA) according to claim 10, wherein the total number of bits in the binary PGA code of the linear programmable switch-capacitance gain amplifier is the number of bits in Maximum Significance Bits (MSB) plus the number of bits in Least Significance Bits (LSB).

12. The linear programmable switch-capacitance gain amplifier (PGA) according to claim 10, wherein the switches connected in series to the first holding capacitors are controlled by the binary code of MSB after being decoded by a decoder.

13. The linear programmable switch-capacitance gain amplifier (PGA) according to claim 11, wherein the switches connected in series to the second sampling capacitors are controlled by the binary code of LSB.

14. The linear programmable switch-capacitance gain amplifier (PGA) according to claim 11, wherein the relation between the second sampling capacitors in the second sampling capacitor switch sets is:

$$C_{n-1} = 2*C_{n-2} = 4*C_{n-3} = \ldots = 2^{n-1}*C_0$$

wherein n represents the number of bits in LSB.

15. The linear programmable switch-capacitance gain amplifier (PGA) according to claim 11, wherein the relation between the first sampling capacitor and the first holding capacitors is:

$$C_{Hx} = \frac{C_S}{10^{\frac{max\_dB\_gain}{20} \times \frac{x}{2^m}}}$$

wherein Cs is the first sampling capacitor, CHx means the first holding capacitors, x ranges $0 \sim 2^m - 1$, m represents the number of bits in MSB.

16. The linear programmable switch-capacitance gain amplifier (PGA) according to claim 15, wherein the relation between the first sampling capacitor and the second sampling capacitor of the least capacitance in the second sampling capacitors is:

$$\frac{C_0}{C_S} \times 2^n = \frac{C_{H0}}{C_{H1}} - 1$$

wherein Co is the second sampling capacitor of the least capacitance in the second sampling capacitors, n represents the number of bits in LSB.

* * * * *